United States Patent
Poh et al.

(10) Patent No.: US 8,277,567 B2
(45) Date of Patent: *Oct. 2, 2012

(54) METHOD OF CLEANING TURBO PUMP AND CHAMBER/TURBO PUMP CLEAN PROCESS

(75) Inventors: Kian-Soong Poh, Singapore (SG);
Jui-Ling Tang, Chiayi (TW);
Chong-Tat Lee, Singapore (SG);
Cheng-Chung Lim, Singapore (SG)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/205,307

(22) Filed: Aug. 8, 2011

(65) Prior Publication Data

US 2011/0284035 A1     Nov. 24, 2011

Related U.S. Application Data

(63) Continuation of application No. 11/754,806, filed on May 29, 2007, now Pat. No. 8,021,492.

(51) Int. Cl.
*B08B 5/00* (2006.01)
*B08B 9/00* (2006.01)

(52) U.S. Cl. .......... 134/22.18; 134/1.1; 134/21; 134/34; 134/37; 156/345.1

(58) Field of Classification Search ............. 134/1.1, 134/19, 21, 22.1, 31, 34, 37; 156/345.1
See application file for complete search history.

(56) References Cited

U.S. PATENT DOCUMENTS

| | | | |
|---|---|---|---|
| 5,149,378 A | 9/1992 | Ohmi et al. | |
| 5,804,259 A | 9/1998 | Robles | |
| 6,019,000 A | 2/2000 | Stanke et al. | |
| 6,079,426 A | 6/2000 | Subrahmanyam et al. | |
| 6,090,706 A | 7/2000 | Telford et al. | |
| 6,410,408 B1 | 6/2002 | Yano | |
| 6,584,987 B1 | 7/2003 | Cheng et al. | |
| 6,596,123 B1 * | 7/2003 | Kwan et al. | 156/345.1 |
| 6,598,615 B1 | 7/2003 | Holland et al. | |
| 6,606,802 B2 * | 8/2003 | Sandhu et al. | 34/448 |
| 2002/0101167 A1 | 8/2002 | Shan et al. | |
| 2005/0199184 A1 | 9/2005 | Murugesh et al. | |
| 2006/0081182 A1 | 4/2006 | Okada et al. | |
| 2008/0258238 A1 | 10/2008 | Rogers | |

FOREIGN PATENT DOCUMENTS

WO     WO 2007127865 A2 * 11/2007

* cited by examiner

*Primary Examiner* — Michael Kornakov
*Assistant Examiner* — Natasha Campbell
(74) *Attorney, Agent, or Firm* — Ding Yu Tan

(57) ABSTRACT

A method of cleaning a turbo pump is described. The turbo pump is coupled with a CVD chamber of depositing a material and thus accumulates the material therein. The method includes switching off the turbo pump and using another pump to pump a reactive gas, which can react with the material to form gaseous products, through the turbo pump. Thereby, the turbo pump is cleaned up and is prevented from being a particle source in subsequent CVD operations.

20 Claims, 3 Drawing Sheets

US 8,277,567 B2

METHOD OF CLEANING TURBO PUMP AND CHAMBER/TURBO PUMP CLEAN PROCESS

CROSS-REFERENCE TO RELATED APPLICATION

This is a continuation application of an application Ser. no. 11/754,806, filed May 29, 2007, which is matured into U.S. Pat. No. 8,021,492. The entirety of the above-mentioned patent are hereby incorporated by reference herein and made a part of this specification.

FIELD OF THE INVENTION

This invention relates to maintenance of equipment used in integrated circuit (IC) manufacture, and more particularly to a method of cleaning a turbo pump installed to a chemical vapor deposition (CVD) chamber and a chamber/turbo pump clean process based on the same method.

BACKGROUND OF THE INVENTION

The CVD technology is widely utilized in IC fabricating processes. For a CVD process needing low pressure like a LPCVD or high-density plasma CVD (HDP-CVD) process, a vacuum pump is installed to the deposition chamber. For a traditional pump like a rotary pump can merely make a low pressure in the order of mTorr, it is usually used in combination with a turbo pump as the required pressure is in the order of Torr.

An exemplary structure of a HDP-CVD system for depositing silicon oxide with a rough pump for rough pumping and a turbo pump is shown in FIG. 1. The chamber 100 has therein a wafer chuck 110 and gas inlets 120. The rough pump 140 is coupled with the chamber 100 via a rough line 130, the turbo pump 150 is coupled with the same by a gate valve, and the rough pump 140 is contiguous with the turbo pump 150 via a foreline 160. In the CVD process, the throttle valve of the rough line 130 is closed but the gate valve is opened, and the rough pump 140 and the turbo pump 150 are both switched on. The unreacted gases and the by-products are conducted from the chamber 100 and through the gate valve, the turbo pump 150, the foreline 160 and the rough pump 140 and then exhausted to a pipeline (not shown).

Because silicon oxide film also accumulates in the chamber 100 to be particle source, the chamber 100 has to be cleaned after being used to process a plurality of wafers. In such a clean process, a halogen-containing gas and its reactive radical capable of reacting with silicon oxide to form gaseous products, such as $NF_3$ and fluorine radical, is delivered through the gas inlets 120 into the chamber 100 with the throttle valve of the rough line 130 opened, the gate valve closed and the rough pump 140 switched on, as shown in FIG. 1. However, even with such a chamber clean step, the reduction in particle number and the mean wafer between clean (MWBC) success ratio are still limited due to the unstable non-lot and inline particle performance.

The particles are suspected to come from the turbo pump 150 because the particles accumulated in the turbo pump 150 may be streamed back to the chamber 100 during a pressure transition of the film formation process. The silicon oxide particles inside the turbo pump 150 cannot be effectively removed by $NF_3$ and fluorine radical because the gate valve is closed in the chamber clean step and the chamber 100 is non-contiguous with the turbo pump 150.

SUMMARY OF THE INVENTION

In view of the foregoing, this invention provides a method of cleaning a turbo pump coupled with a CVD chamber, which can effectively remove the particles of the deposited material accumulated in the turbo pump.

This invention also provides a chamber/turbo pump clean process based on the above method of cleaning a turbo pump.

The method of cleaning a turbo pump of this invention is applied to a turbo pump coupled with a CVD chamber for depositing a material and having accumulated the material therein. The method includes using another pump to pump a reactive gas, which can react with the material to form gaseous products, through the turbo pump.

In many cases of Si-based IC industry, the material deposited in a CVD chamber is a Si-containing material like silicon oxide, silicon nitride or poly-Si, and the reactive gas is a halogen-containing gas that may include at least one of $NF_3$ and F-radical.

The chamber/turbo pump clean process of this invention is based on the method of cleaning a turbo pump of this invention, including at least a chamber clean step and a turbo-pump clean step performed in sequence. In the chamber clean step, the reactive gas is injected into the CVD chamber to remove at least a portion of the material therein. In the turbo pump clean step, another pump is used to pump, from the CVD chamber, the reactive gas through the turbo pump.

It is particularly noted that in the whole specification and claims of this invention, a pump being contiguous with the CVD chamber means that gas can be drawn from the chamber to it without passing another pump, and a pump is still deemed non-contiguous with the chamber even if it can draw gas from the chamber through another pump.

By using the method of cleaning a turbo pump of this invention, the material accumulated in a turbo pump coupled with a CVD chamber can be removed effectively, so that the turbo pump is no longer a particle source of the corresponding CVD process.

In order to make the aforementioned and other objects, features and advantages of the present invention comprehensible, a preferred embodiment accompanied with figures is described in detail below.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

It is particularly noted that though the deposited material is a silicon-containing one, the reactive gas is a halogen-con taining gas and the CVD system discussed is the illustrated one in the following embodiments of this invention, the invention can also be applied to a CVD system having other configuration and/or depositing other genus of material, if only a suitable reactive gas can be found and the piping design of the CVD system allows another pump to pump the reactive gas through the turbo pump.

In addition, though the (non-)contiguity state of the rough pump with the CVD chamber is controlled by a throttle valve of a rough line and the (non-) contiguity state of the turbo pump with the CVD chamber is controlled by a gate valve in the following embodiments, the states may alternatively be controlled by other means.

First Embodiment

Figure 2:
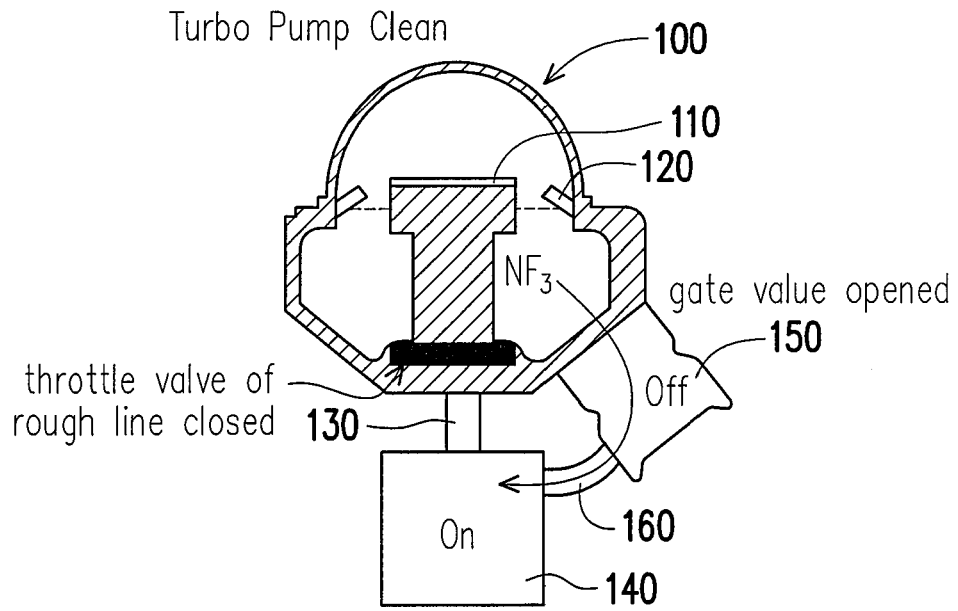
FIG. 2 depicts a method of cleaning a turbo pump coupled with a CVD chamber according to a first embodiment of this invention.

FIG. 2 depicts a method of cleaning a turbo pump coupled with a CVD chamber according to the first embodiment of this invention. The structure of the chamber 100 and the arrangement of the chamber 100, the rough pump 140, the turbo pump 150, the rough line 130 and the foreline 160 are all the same as the above mentioned. However, in the method of this embodiment, the turbo pump 150 is switched off, the throttle valve of the rough line 130 between the chamber 100 and the rough pump 140 is closed to make the rough pump 140 non-contiguous with the chamber 100, and the gate valve between the chamber 100 and the turbo pump 150 is opened to make the turbo pump 150 contiguous with the chamber 100 and make the cleaning gas flow through the turbo pump 150 to remove the particles.

The chamber 100 may be a HDP-CVD chamber used in a process requiring a very low pressure. The wafer chuck 110 may be an electrostatic chuck of mono-polar type or bi-polar type or their combination. The deposited material may be silicon oxide, silicon nitride or poly-Si.

Because the rough pump 140 is contiguous with the turbo pump 150 via the foreline 160, closing the throttle valve of the rough line 130 and opening the gate valve makes the reactive gas (e.g., $NF_3$ and fluorine radical) injected into the chamber 100 to be pumped, from the chamber 100, through the turbo pump 150 and foreline 160 by the rough pump 140, as illustrated in FIG. 2. Therefore, the silicon-containing material accumulated in the turbo pump 150 can be removed effectively.

In the above method, the duration of pumping the halogen-containing gas through the turbo pump 150 may range from 600 seconds to 3600 seconds. Moreover, it is preferred to heat up the turbo pump 150 after the turbo pump 150 is switched off but before the throttle valve of the rough line 130 is closed, so as to increase the rate of the reaction between the Si-containing material and the halogen-containing gas and improve the cleaning efficiency.

The above method may be applied every a constant number of wafers, such as every 500 wafers, processed in the chamber 100 and/or be applied during a preventive maintenance (PM) of the chamber 100, in which each part of the CVD system is cleaned thoroughly and the dome of the chamber 100 replaced by a new one.

In addition, when the above method is to be applied every a constant number of wafers processed in the chamber 100, the thickness of the silicon-containing material accumulated in the chamber 100 may be checked in advance. When the thickness is checked to be not larger than a tolerable value, the method is applied without a clean step of the chamber 100 using the halogen-containing gas as a reactive gas before it. When the thickness is checked to be larger than the tolerable value, the method is applied after a clean step of the chamber 100 using the halogen-containing gas. The purpose of the thickness checking is to save unnecessary chamber cleaning.

In addition, when the above method is applied during a preventive maintenance (PM) of the chamber 100, it is usually applied after a clean step of the chamber 100 that uses the halogen-containing gas as the reactive gas.

Figure 1:
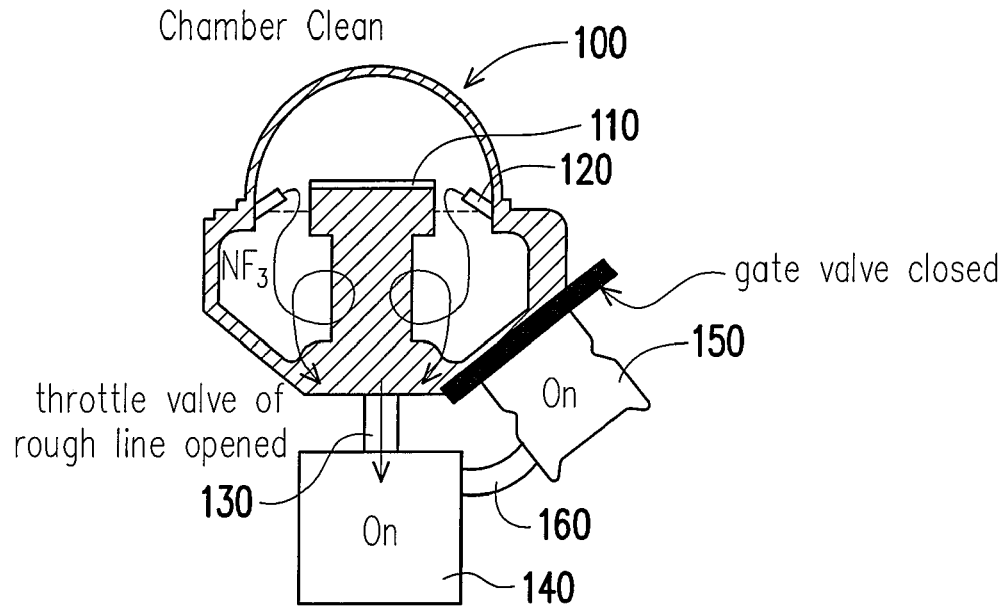
FIG. 1 shows an exemplary structure of a HDP-CVD system with a rough pump and a turbo pump as well as a chamber clean step in the prior art.
Figure 3:
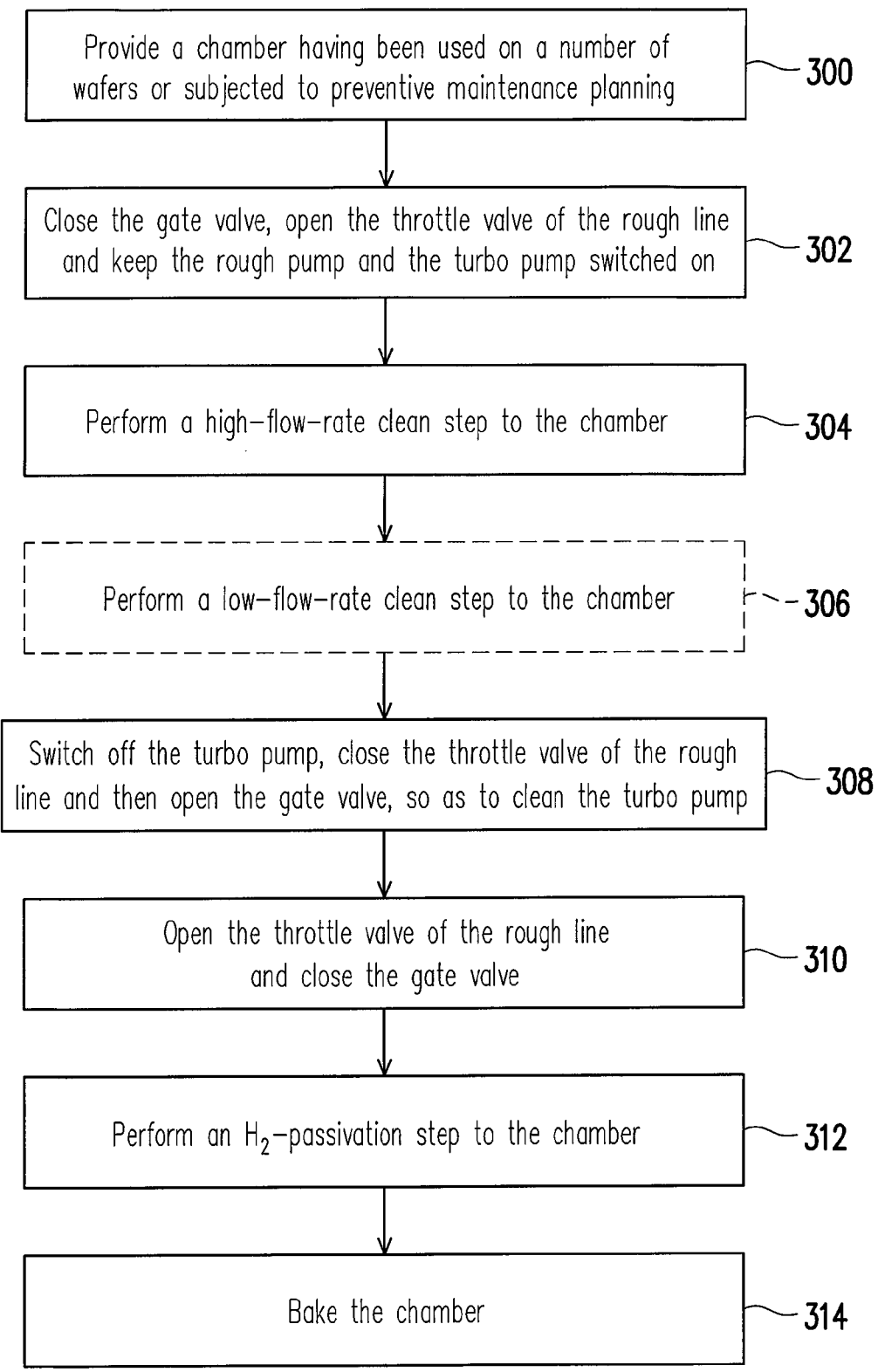
FIG. 3 shows a flow chart of a chamber/turbo pump clean process according to the first embodiment of this invention.

FIG. 3 shows a flow chart of a chamber/turbo pump clean process according to the first embodiment of this invention, wherein the reactive gas is a F-containing gas or F-radical. FIGS. 1-2 are also referred to in the following descriptions of the same.

Firstly, a CVD chamber having been used on a number (e.g., ~500) of wafers or having been subjected to preventive maintenance planning is provided (step 300).

In the step 302, the gate valve between the chamber 100 and the turbo pump 150 is closed to make the turbo pump 150 non-contiguous with the chamber 100, the throttle valve of the rough line 130 between the chamber 100 and the rough pump 140 is opened to make the rough pump 140 contiguous with the chamber 100, and the rough pump 140 and turbo pump 150 both are kept switched on, as shown in FIG. 1.

In next step 304, a high-flow clean step is performed to the chamber 100, wherein the F-containing gas or F-radical is injected from the gas inlets 120 and the flow rate of the same is set such that the pressure in the chamber 100 is in the order of Ton, so as to remove at least a portion of the Si-containing material accumulated on the inner wall of the CVD chamber 100 above a level approximately corresponding to the position of the wafer chuck 110, as indicated by the dash lines in FIG. 1.

After the high-flow clean step, a low-flow clean step can be performed (step 306) in option, wherein the flow rate of the F-containing gas or F-radical injected from the gas inlets 120 is set such that the pressure in the CVD chamber is in the order of mTorr, so as to remove at least a portion of the silicon-containing material on the inner wall of the CVD chamber 100 below the level indicated by the dash lines in FIG. 1.

The high-flow and low-flow clean steps together constitute a chamber clean step. Alternatively, the chamber clean step may include only an above high-flow clean step as a single clean step, because the material accumulated on the inner wall above the level affects the particle numbers on wafers much more that that on the inner wall below the level due to the gravity and the substantially downward gas flow caused by the pumps.

In next step 308, the turbo pump 150 switched off, the throttle valve of the rough line 130 between the chamber 100 and the rough pump 140 is closed to make the rough pump 140 non-contiguous with the chamber 100 and the gate valve between the chamber 100 and the turbo pump 150 is opened to make the turbo pump 150 contiguous with the chamber 100, as shown in FIG. 2, so as to clean the turbo pump 150. The cleaning mechanism has been described above, and the duration of the turbo pump clean step may range from 600 seconds to 3600 seconds. Moreover, it is preferred to heat up the turbo pump 150 after the turbo pump 150 switched off but before the throttle valve of the rough line 130 is closed to improve the cleaning efficiency, as mentioned above.

In next step 310, the throttle valve of the rough line 130 between the chamber 100 and the rough pump 140 is opened to make the rough pump 140 contiguous with the chamber 100, and the gate valve between the chamber 100 and the turbo pump 150 is closed previously to make the turbo pump 150 non-contiguous with the CVD chamber 100, as shown in FIG. 1. It is noted that the fluorine-containing gas or fluorine radical is not supplied from the gas inlets 120 at this moment.

In next step 312, an $H_2$-passivation step is performed to the CVD chamber 100 to remove the fluorine remaining inside the chamber 100 after the step of cleaning the turbo pump 150, by means of reactions between hydrogen and fluorine. The reaction gas used therein may include $H_2$, Ar and $O_2$, and plasma is generated from the reaction gas with suitable RF power allowing reactions between hydrogen and fluorine to occur.

In addition, when the reaction gas used in the H2-passivation step contains $H_2$ and $O_2$, moisture is also formed in the CVD chamber 100 by the reaction between hydrogen and oxygen caused by the plasma. In such a case, it is preferred to bake the chamber 100 (step 314) at a temperature higher than 100° C. after the $H_2$-passivation step and remove the moisture in the chamber 100 for the processing of subsequent wafers.

In addition, the above chamber/turbo pump clean process may be applied every a constant number of wafers, such as every 500 wafers, processed in the CVD chamber and/or be applied during a preventive maintenance of the chamber 100. In a chamber/turbo pump clean process applied every a constant number of wafers processed in the chamber 100, the period of the high-flow clean step is preferably shorter to prevent overheating of the dome of the chamber 100. In a chamber/turbo pump clean process applied during the preventive maintenance, the period of the high-flow clean step is set longer before the dome replacement of the chamber 100 to confirm that there is enough clean time for the particles in the turbo pump 150 to be removed completely.

Moreover, when the above chamber/turbo pump clean process is to be applied every a constant number of wafers processed in the chamber 100, it may be conducted after the thickness of the silicon-containing material accumulated in the CVD chamber 100 is checked to be larger than a tolerable value.

Furthermore, to make a CVD chamber 100 having been subjected to the above chamber/turbo pump clean process ready for the processing of subsequent wafers, a pre-coating step is usually conducted after the above chamber/turbo pump clean process to deposit a thin film, generally a thin oxide film, on the inner wall of the CVD chamber 100, so as to condition the chamber environment in advance for the wafer-to-wafer repeatability between the wafers processed before the above clean process and those processed after the above clean process.

Second Embodiment

Figure 4:
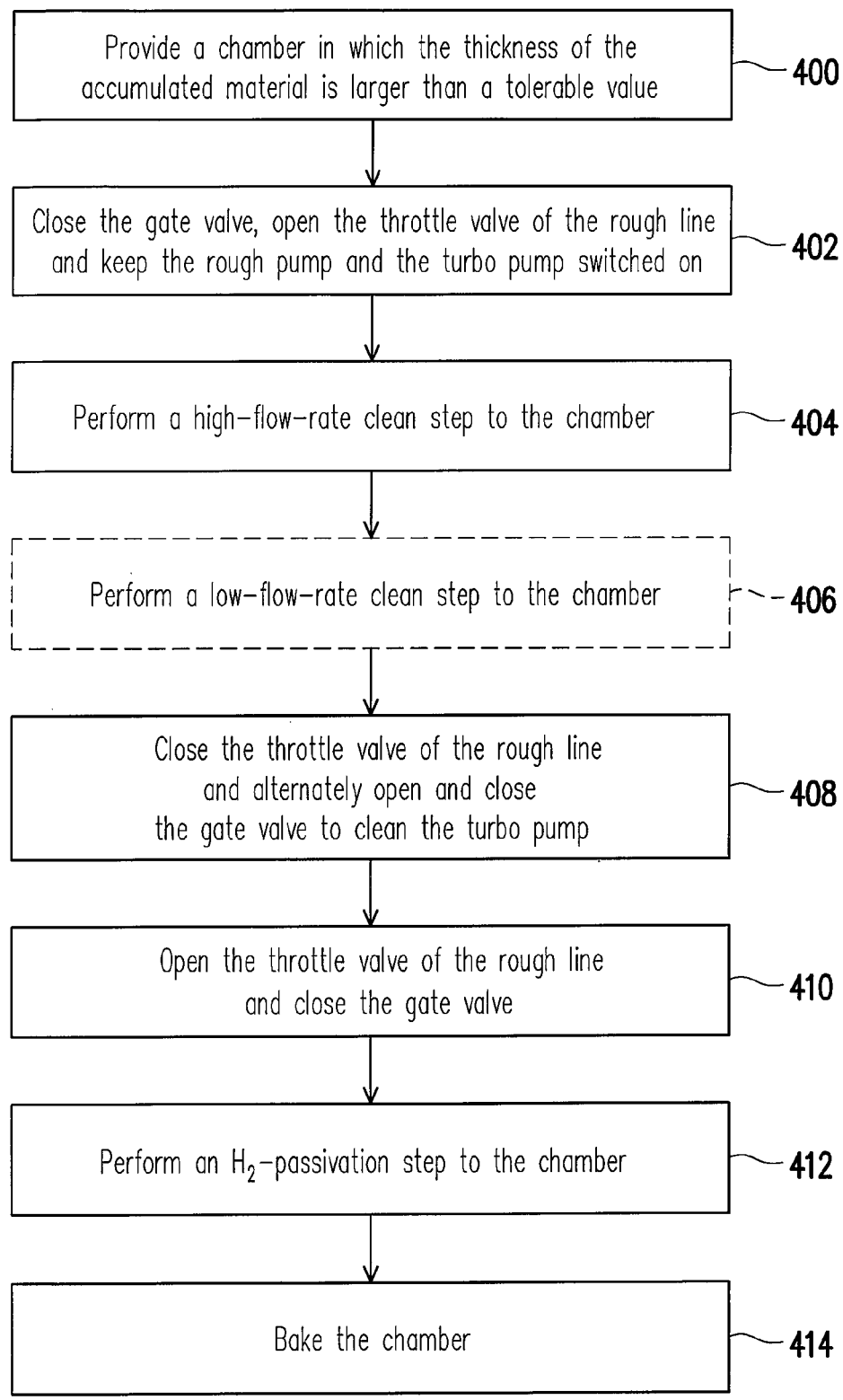
FIG. 4 shows a flow chart of a chamber/turbo pump clean process according to a second embodiment of this invention.

FIG. 4 shows a flow chart of a chamber/turbo pump clean process according to the second embodiment of this invention, wherein the reactive gas is also a fluorine-containing gas or fluorine radical. This process features a shorter equipment up-time, such as one shorter by 4%, as compared with that of the first embodiment. FIG. 1 is also referred to in the following descriptions.

The chamber/turbo pump clean process is conducted after the thickness of the material accumulated in the chamber is checked to be larger than a tolerable value, and the check is conducted every a less number of wafers, such as 25 wafers, or a whole lot of wafers processed in the CVD chamber 100.

In the step 400, a chamber in which the thickness of the accumulated material is larger than a tolerable value is provided. In the step 402, the gate valve between the chamber 100 and the turbo pump 150 is closed to make the turbo pump 150 non-contiguous with the chamber 100, the throttle valve of the rough line 130 between the CVD chamber 100 and the rough pump 140 is opened to make the rough pump 140 contiguous with the chamber 100, and the rough pump 140 and the turbo pump 150 both are kept switched on, as shown in FIG. 1.

In next step 404, a high-flow clean step is performed to the chamber 100, wherein the F-containing gas or F-radical is injected from the gas inlets 120, and the flow rate of the same is set such that the pressure in the chamber 100 is in the order of Torr, so as to remove at least a portion of the Si-containing material accumulated on the inner wall of the CVD chamber 100 above a level approximately corresponding to the position of the wafer chuck 110 and as indicated by the dash lines in FIG. 1.

After the high-flow clean step, a low-flow clean step can be performed (step 406) in option, wherein the flow rate of the fluorine-containing gas injected from the gas inlets 120 is set such that the pressure in the CVD chamber is in the order of mTorr, so as to remove at least a portion of the silicon-containing material on the inner wall of the CVD chamber 100 below the level indicated by the dash lines in FIG. 1.

The high-flow and low-flow clean steps constitute a chamber clean step, but the chamber clean step may alternatively include only an above high-flow clean step.

In next step 408, the throttle valve of the rough line 130 between the chamber 100 and the rough pump 140 is closed to make the rough pump 140 non-contiguous with the chamber 100 and the gate valve between the chamber 100 and the turbo pump 150 is operationally opened and closed in turns to make the turbo pump 150 alternately contiguous and non-contiguous with the chamber 100 to clean the turbo pump 150, wherein the turbo pump 150 is kept at the on-state. In such an embodiment, the duration of the turbo pump clean step may range from 1 second to 10 seconds. Moreover, it is preferred to heat up the turbo pump 150 before the clean step to improve the cleaning efficiency, as mentioned above. The turbo pump may be made contiguous and non-contiguous with the CVD chamber for at least three cycles.

In next step 410, the throttle valve of the rough line 130 between the chamber 100 and the rough pump 140 is opened to make the rough pump 140 contiguous with the chamber 100, and the gate valve between the chamber 100 and the turbo pump 150 is closed to make the turbo pump 150 non-contiguous with the CVD chamber 100, as shown in FIG. 1. It is noted that the fluorine-containing gas or fluorine radical is not supplied from the gas inlets 120 at this moment.

In next step 412, an $H_2$-passivation step is performed to the CVD chamber 100 to remove the fluorine remaining inside the chamber 100 after the step of cleaning the turbo pump 150. In next step 414, the chamber 100 is baked at a temperature higher than 100° C. to remove the moisture in the chamber 100. The details of the steps 412 and 414 are the same as those mentioned in the first embodiment.

By using the method of cleaning a turbo pump of this invention, the material accumulated in a turbo pump coupled with a CVD chamber can be removed effectively and completely so that the turbo pump is no longer a particle source.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method of cleaning a turbo pump that is coupled with a CVD chamber for depositing a material and thus accumulates the material therein, comprising: switching off the turbo pump and using another pump to pump a reactive gas, which can react with the material to form gaseous products, through the turbo pump.

2. The method of claim 1, wherein the reactive gas is pumped through the turbo pump for 600 to 3600 seconds.

3. The method of claim 1, wherein
the reactive gas is pumped through the turbo pump from the CVD chamber, and
the another pump comprises a rough pump for rough pumping, which is made non-contiguous with the CVD chamber but is contiguous with the turbo pump.

4. The method of claim 3, wherein
the turbo pump is switched off before the rough pump is made non-contiguous with the CVD chamber, and
the turbo pump is made contiguous with the CVD chamber after the rough pump is made non-contiguous with the CVD chamber.

5. The method of claim 3, wherein a state of the rough pump being contiguous or non-contiguous with the CVD chamber is controlled by switching a throttle valve of a rough line between the rough pump and the CVD chamber to open or close, and a state of the turbo pump being contiguous or non-contiguous with the CVD chamber is controlled by switching a gate valve between the turbo pump and the CVD chamber to open or close.

6. The method of claim 3, wherein the turbo pump is heated up after the turbo pump is switched off but before the rough pump is made non-contiguous with the CVD chamber.

7. The method of claim 1, which is applied after every constant number of wafers processed in the CVD chamber.

8. The method of claim 1, which is applied after a thickness of the material accumulated in the CVD chamber is checked, wherein
the reactive gas is pumped through the turbo pump from the CVD chamber; and
when the thickness is checked to be larger than a tolerable value, the method is applied after a clean step of the CVD chamber using the reactive gas.

9. The method of claim 1, which is applied for a preventive maintenance of the CVD chamber.

10. The method of claim 9, which is applied after a clean step of the CVD chamber using the reactive gas, wherein the reactive gas is pumped through the turbo pump from the CVD chamber.

11. A chamber/turbo pump clean process, wherein the turbo pump is coupled with a CVD chamber for depositing a material and thus accumulates the material therein, the process comprising:
performing a chamber clean step that comprises injecting a reactive gas, which reacts with the material to form gaseous products, into the CVD chamber to remove at least a portion of the material accumulated in the CVD chamber through a rough pump;
performing a turbo pump clean step that comprises switching off the turbo pump and using another pump to pump, from the CVD chamber, the reactive gas through the turbo pump.

12. The chamber/turbo pump clean process of claim 11, wherein the chamber clean step comprises:
a high-flow clean step with a relatively higher flow rate of the reactive gas such that a pressure in the CVD chamber is in the order of Torr; and
a low-flow clean step with a relatively lower flow rate of the reactive gas such that a pressure in the CVD chamber is in the order of mTorr.

13. The chamber/turbo pump clean process of claim 11, wherein the chamber clean step comprises a single clean step with a flow rate of the reactive gas such that a pressure in the CVD chamber is in the order of Torr.

14. The chamber/turbo pump clean process of claim 11, wherein the another pump comprises the rough pump coupled with the CVD chamber, further comprising:
in the chamber clean step, making the turbo pump non-contiguous with the CVD chamber, making the rough pump contiguous with the CVD chamber and keeping the rough pump and the turbo pump both switched on;
in the turbo pump clean step, making the rough pump non-contiguous with the CVD chamber and making the turbo pump contiguous with the CVD chamber.

15. The chamber/turbo pump clean process of claim 14, wherein a state of the rough pump being contiguous or non-contiguous with the CVD chamber is controlled by switching a throttle valve of a rough line between the rough pump and the CVD chamber to open or close, and a state of the turbo pump being contiguous or non-contiguous with the CVD chamber is controlled by switching a gate valve between the turbo pump and the CVD chamber to open or close.

16. The chamber/turbo pump clean process of claim 14, further comprising heating up the turbo pump after the turbo pump is switched off but before the rough pump is made non-contiguous with the CVD chamber.

17. The chamber/turbo pump clean process of claim 11, wherein the turbo pump clean step is performed for 600 to 3600 seconds.

18. The chamber/turbo pump clean process of claim 11, wherein the reactive gas comprises at least one of a fluorine-containing gas and fluorine radical, the process further comprising:
performing, after the turbo pump clean step, an $H_2$-passivation step to the CVD chamber to remove fluorine remaining in the CVD chamber.

19. The chamber/turbo pump clean process of claim 18, wherein the $H_2$-passivation step comprises using a reaction gas containing $H_2$ and $O_2$ to generate plasma.

20. The chamber/turbo pump clean process of claim 18, further comprising:
baking the CVD chamber after the $H_2$-passivation step to remove moisture formed due to the plasma.

* * * * *